(12) United States Patent
Ishitani (10) Patent No.: US 8,042,221 B2
(45) Date of Patent: Oct. 25, 2011

(54) BOARD CLEANING APPARATUS AND BOARD TRANSPORTING APPARATUS

(75) Inventor: Yasuyuki Ishitani, Yamanashi (JP)

(73) Assignee: Panasonic Corporation, Osaka (JP)

( * ) Notice: Subject to any disclaimer, the term of this patent is extended or adjusted under 35 U.S.C. 154(b) by 475 days.

(21) Appl. No.: 11/487,332

(22) Filed: Jul. 17, 2006

(65) Prior Publication Data

US 2007/0017088 A1    Jan. 25, 2007

(30) Foreign Application Priority Data

Jul. 19, 2005  (JP) ................................ 2005-208167

(51) Int. Cl.
*A47L 5/00* (2006.01)
*A47L 9/04* (2006.01)
*A47L 9/06* (2006.01)
*A47L 13/40* (2006.01)

(52) U.S. Cl. ................ 15/354; 15/394; 15/398; 15/399; 15/15.1

(58) Field of Classification Search ............. 15/364, 15/1.51, 394, 398, 399, 383–392
See application file for complete search history.

(56) References Cited

U.S. PATENT DOCUMENTS

| | | | | |
|---|---|---|---|---|
| 1,940,954 A * | 12/1933 | Kohler | ............................. | 15/364 |
| 3,395,042 A * | 7/1968 | Herbert, Jr. | ....................... | 134/1 |
| 3,420,004 A * | 1/1969 | O'Brien | .......................... | 451/54 |
| 3,780,391 A * | 12/1973 | Leenhouts | ..................... | 15/1.51 |
| 3,915,737 A * | 10/1975 | Sroka | ................................ | 134/1 |
| 3,986,223 A * | 10/1976 | Kiefer | ............................ | 15/1.51 |
| 4,706,325 A * | 11/1987 | Michelson | ....................... | 15/308 |
| 5,233,395 A * | 8/1993 | Kohyama | ....................... | 399/314 |
| 5,980,646 A * | 11/1999 | DeRosa | ........................... | 134/21 |
| 6,131,235 A * | 10/2000 | Snyder | ............................ | 15/308 |
| 7,549,190 B2 * | 6/2009 | Oh et al. | .......................... | 15/364 |
| 2006/0236500 A1 * | 10/2006 | Oh et al. | .......................... | 15/366 |

FOREIGN PATENT DOCUMENTS

| | | |
|---|---|---|
| JP | 60-124688 | 8/1985 |
| JP | 64-5691 | 1/1989 |
| JP | 2-50822 | 2/1990 |
| JP | 5-49826 | 3/1993 |
| JP | 7-202406 | 8/1995 |
| JP | 7-211680 | 8/1995 |
| JP | 2003-334499 | 11/2003 |
| JP | 2004-41761 | 2/2004 |
| JP | 2005-90956 | 4/2005 |

OTHER PUBLICATIONS

Japanese Office Action, with English translation, issued Aug. 24, 2010 in connection with corresponding Japanese Application No. 2005-208167.

* cited by examiner

*Primary Examiner* — Bryan R Muller

(74) *Attorney, Agent, or Firm* — Wenderoth, Lind & Ponack, L.L.P.

(57) ABSTRACT

The present invention provides a board cleaning apparatus excellent in foreign-matter removing efficiency. Fixed brushes are each made in contact with a circuit board over an entire width thereof, and attached to a case of a board cleaning apparatus respectively on the upstream side and the downstream side of the case in the board transporting direction with respect to a rotary brush for removing and ejecting foreign matters. This arrangement makes it possible to cover a gap between the circuit board and the case to prevent a board transporting rail to be moved so as to be shifted in accordance with circuit boards having various dimensions from intervening with the case.

19 Claims, 6 Drawing Sheets

BOARD CLEANING APPARATUS AND BOARD TRANSPORTING APPARATUS

BACKGROUND OF THE INVENTION

The present invention relates to a board cleaning apparatus and a board transporting apparatus, for removing foreign matter such as dust, dirt and other adherents from a surface of a circuit board in a circuit board transporting process.

In general, electrode terminals and circuits are printed on one side or both sides of a circuit board. Then, an adhesive layer is printed on the circuit board and components are mounted on the circuit board. Further, the circuit board is subjected to electrical connection by soldering reflow; thus, a product is obtained. During these processes, foreign matter tends to adhere to the surface of the circuit board upon processing and in the middle of the transporting process, and might cause an issue with the product. In order to improve this issue, a process of removing foreign matter from the circuit board is generally carried out at an appropriate stage in the middle of the processing and transporting processes.

Conventionally, the foreign-matter removing process has been carried out through processes, such as air blowing onto the surface of the circuit board, pressing a fixed brush thereon, pressing a sticky roller thereon and a manual operation using a cloth; however, these processes do not necessarily provide the desired results. For example, in the case where foreign matter firmly sticks to the surface of the circuit board due to moisture and scattered adhesive or the like, the air blowing process fails to remove the foreign matter. Moreover, the pressing of a fixed brush thereon fails to sufficiently remove the foreign matters although a static-eliminating effect is obtained, and, in the case where the foreign matter overlaps each other, the pressing of a sticky roller tends to cause some of the foreign matter to be left on the circuit board, and also requires time-consuming replacing processes after the use of a predetermined amount of the sticky roller.

In the conventional art, a technique has been proposed in which an air blower, an air aspirator, a rotary brush and transporting rollers are housed in a semi-cylindrical shaped container using a bellows or the like, and the containers are placed on both of the faces of the circuit board to completely cover the circuit board from both of the sides so that foreign matters are removed therein (for example, see Japanese Unexamined Patent Publication No. H02-50822). However, the apparatus of this type becomes bulky, and it is difficult to attach the apparatus to a limited space back or front the processing apparatus, or in the transporting apparatus for the circuit board.

Figure 5A:
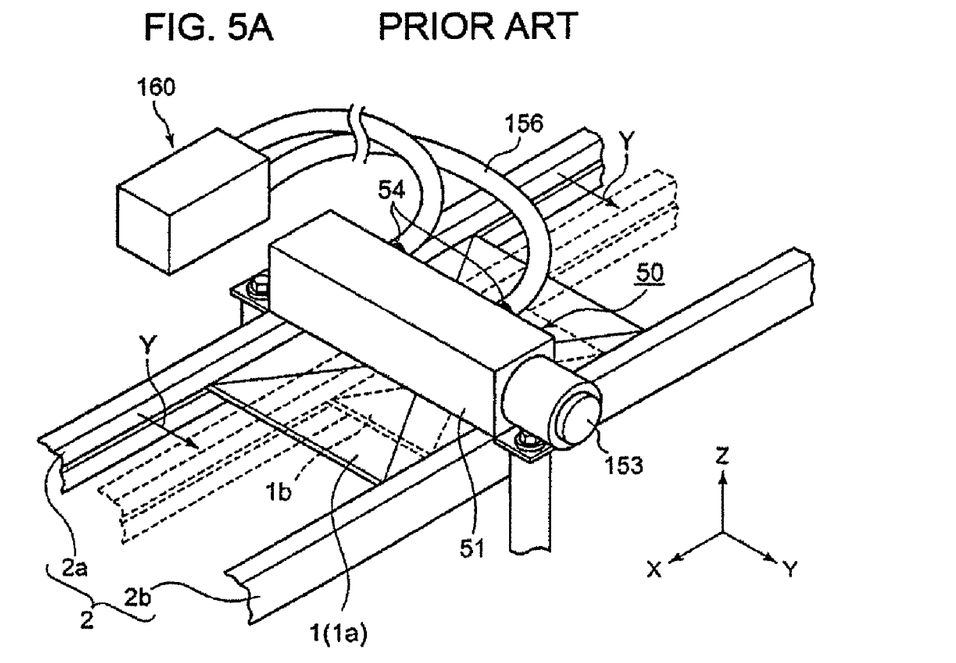
FIG. 5A is a perspective view that shows an outline of a board cleaning apparatus and a board transporting apparatus in accordance with the conventional art.
Figure 5B:
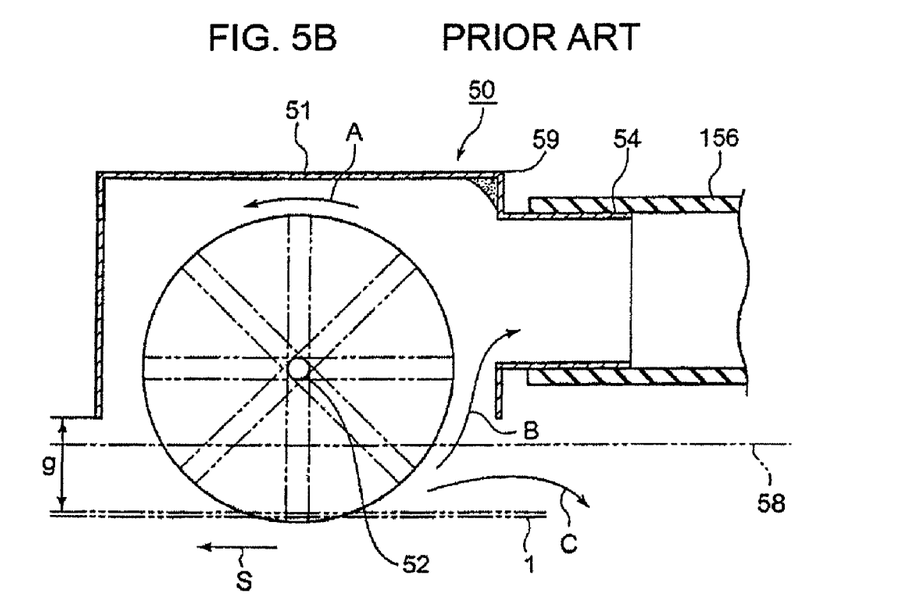
FIG. 5B is a cross-sectional side view that shows an outline of a board cleaning apparatus in accordance with the conventional art.

In order to improve these issues, in the conventional art also, a board cleaning apparatus for a circuit board, which has a small size and is easily attached, has been proposed. FIGS. 5A and 5B show the outline of the board cleaning apparatus structure. FIG. 5A is a perspective view showing a board transporting apparatus equipped with the board cleaning apparatus 50, and FIG. 5B is a cross-sectional view of the board cleaning apparatus 50 taken along the XZ-plane of FIG. 5A. In FIGS. 5A and 5B, the board cleaning apparatus 50 is provided with a case 51, a rotary brush 52 installed in the case 51, a motor 153,for driving a rotation of the rotary brush 52 and a cylindrical duct 54 that sucks foreign matters by introducing negative-pressure air to the board cleaning apparatus 50. The duct 54 is connected to a negative-pressure supply source 160 installed outside the case 51 through a hose 156.

A circuit board 1 (numeral 1a indicated by a solid line or numeral 1b indicated by a broken line in FIG. 5A) is transported while being supported by a pair of opposing board transporting rails 2 (2a and 2b). Each of the board transporting rails 2a and 2b has a virtually U-shaped cross section with a concave section provided in a center portion thereof, and conveyor belts, not shown, are housed inside the concave section. The circuit board 1 is inserted into the concave section in the U-shaped cross section of the two board transporting rails 2a and 2b, and placed on the conveyor belts to be transported in the X-direction of FIG. 5A (the board transporting direction "S" in FIG. 5B).

When the board cleaning apparatus 50 having the above-mentioned structure is operated, the rotary brush 52 (see FIG. 1B), which has been made face to face with the circuit board 1 transported by the paired board transporting rails 2, is allowed to rotate in a direction indicated by an arrow A to brush the surface of the circuit board 1 so that foreign matters that adhere to the surface of the circuit board 1 are wiped off and ejected by the rotary brush 52. A suction force is exerted in the duct 54 connected to the negative-pressure supply source 160 through the hose 156 so that the foreign matters, removed and ejected by the rotary brush 52 to float in the case 51, are sucked into the duct 54 as indicated by an arrow B through a function of the negative-pressure air from the negative-pressure supply source 160 and removed.

SUMMARY OF THE INVENTION

However, the board cleaning apparatus 50 has several issues. First, in FIG. 5A, the board transporting rails 2 need to transport circuit boards having various different width dimensions (the length in the width direction (Y-direction)). In the case where the board transporting rails 2 are switched from a state that a wide-width circuit board 1a is transported as indicated by the solid line of FIG. 5A to a state that a narrow-width circuit board 1b is transported as indicated by a broken line of FIG. 5A, one of the board transporting rails 2a needs to be moved so as to be shifted toward the other opposing board transporting rail 2b as indicated by an arrow Y. For example, since the board transporting rails 2 transport circuit boards 1 having a width in a range from 50 mm to 250 mm, or in a range from 50 to 510 mm, it needs to carry out the width-shifting operation in accordance with the width dimension of the circuit board 1, each time the switching is made.

In the case where the width dimension of the circuit board 1 has the maximum permissible width of the board cleaning apparatus 50 (the wide-width circuit board 1a), since the circuit board 1 is present over the entire width (the entire length in the Y-direction) of the board cleaning apparatus 50 as indicated by a solid line of FIG. 5A, an issue does not occur. However, in the case where the narrow-width circuit board 1b, as indicated by the broken line of FIG. 5A, is cleaned, one of the board transporting rails 2a is moved so as to be shifted toward the other of the board transporting rails 2b as indicated by the arrow Y with the result that the lower portion of the board cleaning apparatus 50 corresponding the shift distance is opened to form an opening. For this reason, a leak of negative-pressure air from the negative-pressure supply source 160 occurs in the opening, resulting in the issue that the suction force to the foreign matters is not sufficiently exerted.

Moreover, in FIG. 5B, a gap (clearance) "g" is generated between the lower portion of the case 51 of the board cleaning apparatus 50 and the surface of the circuit board 1. Upon the width-shifting operation of one of the board transporting rail 2a, the gap "g" is prepared so as to prevent the case 51 from intervening with the upper end face 58 of the board transporting rail 2a, indicated by a two dots chain line in FIG. 5B. The presence of the gap "g" results in leak of negative-pressure to weaken the suction force to the foreign matters, and also causes the foreign matters wiped off and ejected by the rotary brush 52 to drop downward below the board cleaning apparatus 50 without being directed to the duct 54, as indicated by an arrow C in FIG. 5B, to be accumulated on the floor.

In addition, the rotary brush 52 with the foreign matters adhering to itself tends to again come into contact with the circuit board 1, or the foreign matters are accumulated on a corner portion 59 in the case 51 as indicated in FIG. 5B due to factors, such as the shape of the case 51 and the layout of the duct 54, and the foreign matters accumulated on the corner portion 59 drop downward below so that the foreign matters might again adhere to the circuit board 1. Because of these issues, the foreign-matter removing efficiency of the board cleaning apparatus 50 in accordance with the conventional art, as shown in FIGS. 5A and 5B, is not necessarily high, resulting in an issue with the deterioratequality of the circuit board 1.

Accordingly, an object of the present invention is to provide a board cleaning apparatus and a board transporting apparatus excellent in foreign-matter removing efficiency as compared with the conventional art.

The present invention adopts a fixed brush for covering a gap between a case of a board cleaning apparatus and a surface of a circuit board, adopts a duct and a rotary brush each efficiently removing foreign matters from the circuit board, and/or provides a cover for covering a opening formed below the board cleaning apparatus when a board transporting rail is moved so as to be shifted in accordance with the width dimension of the circuit board to thereby improve the above-mentioned issues. Specifically, the present invention incorporates the following aspects.

One aspect of the present invention relates to a board cleaning apparatus comprising: a box-shaped case that has an opened face opposing to a surface of a circuit board supported by a pair of board transporting rails of a board transporting apparatus and transported in a board transporting direction and is placed so as to extend in a width direction of the circuit board orthogonal to the transporting direction; a rotary brush that is installed in the case, for rotating around an axis arranged so as to extend in the width direction of the circuit board; a motor for driving a rotation of the rotary brush; a duct that is communicated with and connected to the case so as to suck air inside the case; and fixed brushes, each of which is placed on an upstream side and a downstream side of the case in the board transporting direction, with respect to the rotary brush, and is made in contact with the surface of the circuit board over an entire width thereof, wherein in a state that either one of the fixed brushes placed on the upstream side and the downstream side is made in contact with the surface of the circuit board, the duct sucks air in the case while the motor allows the rotary brush to rotate, by which foreign matters adhering to the surface of the circuit board transported in the board transporting direction are removed.

The fixed brush placed on the upstream side may be tilted so that an end of the fixed brush is placed toward the downstream side in the board transporting direction. Moreover, one of the fixed brushes is made of a conductive material so that static electricity in the circuit board may be static-eliminated through the fixed brush.

The rotary brush may have two spiral-shaped brushes that are joined (connected) to each other near a center position of the rotary brush in the width direction of the circuit board, the spiral-shaped brushes having spiral directions reversed to each other, and the duct may be formed into a funnel shape having one of opening ends communicated with and connected to the case at one point near a center of the case in the width direction of the circuit board.

Further, the board cleaning apparatus may comprise a cover for covering an opening of an opened face of the case, the opening being caused when the paired board transporting rails are moved so as to be shifted in accordance with the width dimension of the circuit board.

The cover may be configured by a shutter member that has one end secured to a housing attached to either one of the board cleaning apparatus and the board transporting rails, and is housed in the housing, and the other end of the shutter member may be secured to the other one of the board cleaning apparatus and the board transporting rails.

Any of the above-mentioned board cleaning apparatuses may comprise an effector plate that has one end attached to the case or the duct, and the other end, serving as a free end, made in contact with a peripheral portion of the rotary brush.

The effector plate may be formed to wipe off the foreign matters adhering to the rotary brush and to guide the foreign matters wiped off and ejected by the rotary brush toward the duct.

Another aspect of the present invention relates to a board transporting apparatus comprising: a pair of board transporting rails for supporting a circuit board from both sides thereof in a width direction; a pair of conveyor belts that are installed inside the pair of board transporting rails, respectively, for transporting the circuit board along the pair of board transporting rails in a board transporting direction; and any one of the above-mentioned board cleaning apparatuses that remove foreign matters adhering to a surface of the circuit board transported in the board transporting direction.

According to the present invention, the fixed brushes, made in contact with the surface of the circuit board over an entire width thereof, are provided on the upstream side and the downstream side of the case in the board transporting direction with respect to the rotary brush. Therefore, the fixed brushes can cover a gap between the case and the surface of the circuit board. Accordingly, since a leak of negative-pressure air from the suction device can be reduced considerably, efficiency for removing foreign matters on the circuit board can be enhanced as compared with that in the conventional art. As a result, it is possible to improve the quality of the circuit board and also improve the quality of an electronic device using the circuit board.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

Figure 1:
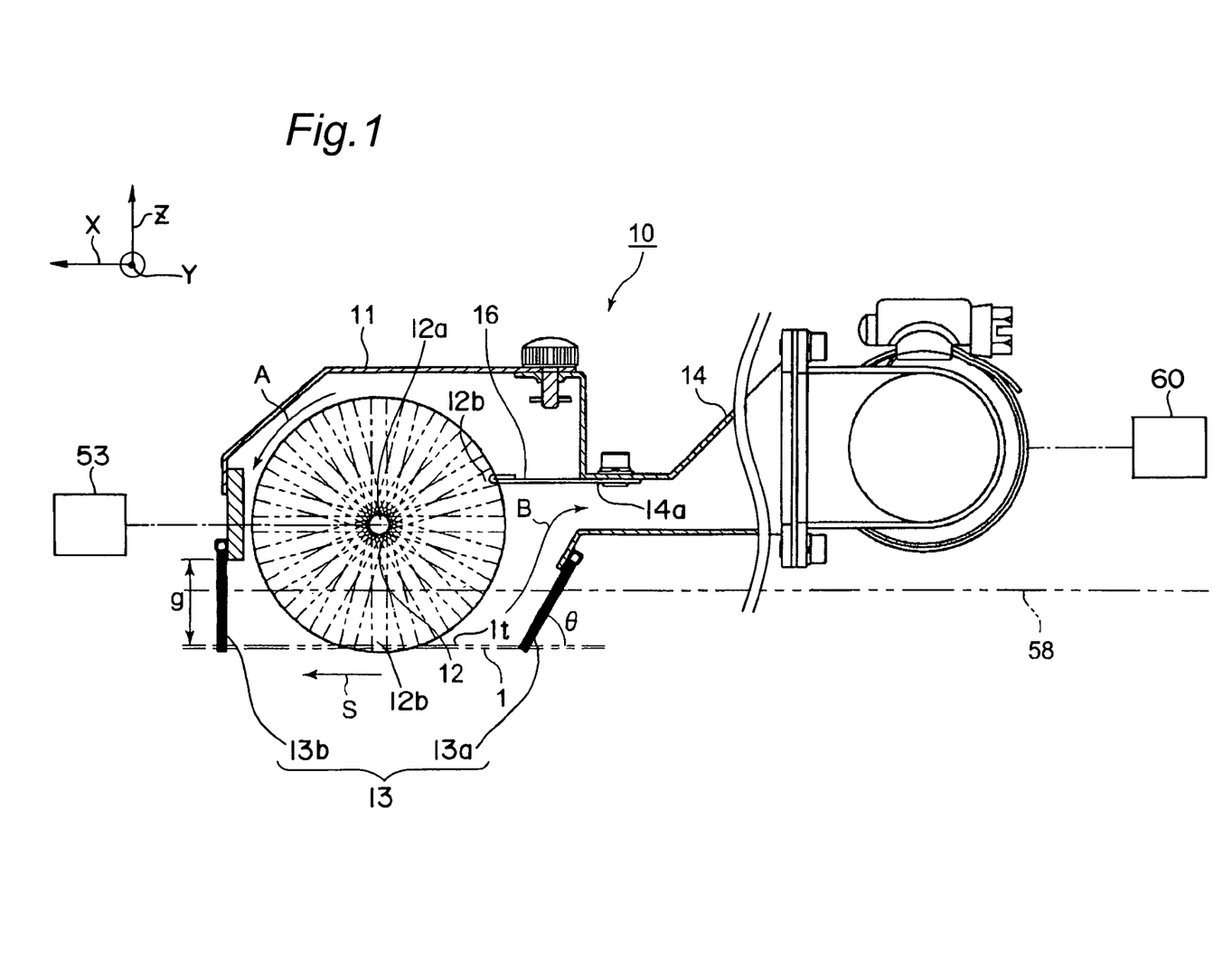
FIG. 1 is a cross-sectional side view that shows a board cleaning apparatus in accordance with an embodiment of the present invention.

Referring to the drawings, the following description will discuss a board cleaning apparatus in accordance with a first embodiment of the present invention. FIG. 1 shows a cross-sectional view taken along a board transporting direction "S" (XZ-plane) of a circuit board 1 of a board cleaning apparatus 10 in accordance with the first embodiment. In FIG. 1, the board cleaning apparatus 10 is provided with a case 11, a rotary brush 12 installed within the case 11, a motor 53 for rotationally driving the rotary brush 12, a pair of fixed brushes 13 (13a and 13b) that are installed respectively on the upstream and downstream sides of the case 11 in the board transporting direction "S" and a duct 14 that is connected to a negative-pressure supply source 60 and introduces a negative-pressure air into the case 11 so as to suck foreign matters floating in the case 11. The duct 14 will be described later in detail in the following second embodiment. Here, "Introducing the negative-pressure" is to decrease a pressure in the case 11 by sucking air in the case 11 through the duct 14.

The case 11, which is formed into a container shape (box shape) with a face (lower face) that faces a surface 1t of the circuit board 1 being opened, is placed so as to extend in a direction perpendicular to the drawing of FIG. 1 (also referred to as a Y-direction or a width direction of the circuit board 1), in a manner so as to bridge the circuit board 1 in the width direction. The rotary brush 12, which is placed inside the case 11, is allowed to rotate around a shaft 12a that extends in the Y-direction. In general, the rotary brush 12 is prepared as a brush that is attached along the shaft 12a in a manner so as to be wound up in a spiral around the shaft 12a, and is allowed to rotate in a direction indicated by an arrow A when driven by the motor 53. The two fixed brushes 13a and 13b have flexibility and are placed along virtually the entire length of the lower portion of the case 11 in the Y-direction, respectively; as shown in FIG. 1, neither of the fixed brushes have flared bristles. The duct 14 has a suction port 14a as one example of one of opening ends placed at a position that foreign matters wiped off and ejected from the surface 1t of the circuit board 1 toward the right side in FIG. 1 by a peripheral portion 12b of the rotary brush 12 rotating in the direction of the arrow A are easily sucked, and is communicated with and connected to the case 11. A double two-dot chain line below FIG. 1 indicates the surface position of the circuit board 1, and an other two-dot chain line above the above-mentioned surface position of the circuit board 1 and below the case 11 indicates a upper end face 58 of a board transporting rails 2.

Upon operation of the board cleaning apparatus 10 having the above-mentioned structure, with respect to the surface 1t of the circuit board 1 transported in the board transporting direction "S" by the paired board transporting rails 2a and 2b (see FIG. 2 or 5A), the rotary brush 12 rotates in the direction indicated by the arrow A so that the surface 1t of the circuit board 1 is brushed. Thus, the foreign matters adhering to the surface 1t of the circuit board 1 by brushing of the rotary brush 12 are wiped off and ejected from the surface 1t of the circuit board 1 toward the suction port 14a side of the duct 14 (right side in FIG. 1). A suction force is acted on the duct 54 connected to the negative-pressure supply source 60, and the foreign matters wiped off and ejected from the surface 1t of the circuit board 1 by the rotary brush 12 and floating in the case 11 are sucked into the duct 14 as indicated by an arrow B, through the function of the negative-pressure air, and removed from the case 11.

The paired fixed brushes 13a and 13b, placed in the board cleaning apparatus 10 in accordance with the first embodiment, have the following additional functional effects in addition to the above-mentioned functional effect of removing the foreign matters.

First, as clearly indicated by FIG. 1, the two fixed brushes 13a and 13b cover a gap "g" between the case 11 and the surface 1t of the circuit board 1 and surround the case 11 together with the circuit board 1 to prevent a leak of the negative-pressure air, thereby keeping the negative-pressure in the case 11, preventing degradation in a cleaning efficiency (foreign-matter removing efficiency).

Moreover, the fixed brush 13a, placed on the upstream side in the board transporting direction "S" is allowed to keep the foreign matters wiped off and ejected from the surface 1t of the circuit board 1 by the rotary brush 12 inside the case 11 so as not to be dropped in the clearance (the gap "g" between the case 11 and the circuit board 1, and direct the foreign matters to the inside of the duct 14 as indicated by the arrow B. For this reason, the two fixed brushes 13a and 13b are preferably designed to have a dense structure as much as possible.

Next, in the case where a narrow-width circuit board 1b (see FIG. 5A) is cleaned (removal of foreign matters), even if either one of the board transporting rails 2a is moved so as to be shifted in the Y-direction, the two fixed brushes 13a and 13b have respectively flexibility so that the shifting of the board transporting rails 2 is not prevented. For this reason, even in the presence of the two fixed brushes 13a and 13b, either one of the board transporting rails 2a can be shifted to any position in the width direction (the Y-direction) in response to the size of the width dimension (the length in the width direction) of the circuit board 1, with each of the fixed brushes 13a and 13b being made in contact with the entire width (the entire length in the width direction) of the surface 1t of circuit board 1, irrespective of the width dimension of the circuit board 1, so that the gap "g" between the case 11 and the circuit board 1 is always effectively sealed.

In this case, with respect to the shifting of the paired board transporting rails 2a and 2b, either one of the rails may be shifted toward the other, or both of the rails may be relatively shifted. In any of these cases, each of the fixed brushes 13a and 13b of the first embodiment does not intervene with the movements of the paired board transporting rails 2a and 2b.

Moreover, as indicated by angle $\theta$ in FIG. 1, the fixed brush 13a, placed on the upstream side with respect to the board transporting direction "S" of the circuit board 1, is preferably attached with a tilt angle along the board transporting direction "S" from a direction (Z-direction) perpendicular to the surface 1t of the circuit board 1. In other words, the fixed brush 13a on the upstream side is attached to the lower portion of the upstream-side face of the case 11 in the board transporting direction "S" so as to tilt while approaching the surface 1t of the circuit board 1 as the fixed brush 13a moves toward the downstream side in the board transporting direction "S" With this arrangement, two effects can be obtained.

One of the effects is that, since the tilt is made along the rotation tangent direction of the rotary brush 12, the foreign matters ejected from the surface 1t of the circuit board 1 by the rotary brush 12 are easily directed along a stream of the negative-pressure air and sucked into the duct 14 smoothly so that the foreign matters are prevented from being accumulated on corner portions and the like in the case 11. Moreover, by the above-mentioned tilt, the stream of the negative-pressure air can be smoothly guided toward the duct 14 from the rotary brush 12, thereby making it possible to prevent the foreign matters from leaking through the gap "g" to fall down.

The other effect obtained by tilting the fixed brush 13a on the upstream side is to make the transporting process of the circuit board 1 smoothly. The circuit board 1 is placed on paired conveyor belts 71a and 71b (see FIG. 2) placed inside each of the board transporting rails 2a and 2b, and transported in the board transporting direction "S" in such a manner that a motor 72 coupled to the paired conveyor belts 71a and 71b is driven. Then, the circuit board 1 is transported to advance in the board transporting direction "S" by the paired conveyor belts 71a and 71b. Before the circuit board 1 is carried in the case 11, the circuit board 1 comes into contact with the fixed brush 13a. Herein, the transporting operation of the circuit board 1 might be stopped at the front side of the fixed brush 13a (upstream side in the board transporting direction "S"if the resistance of the fixed brush 13a is strong (flexibility is weak). In this case, the propelling force to transport the circuit board 1 in the board transporting direction "S" is dependent on the weight of the circuit board 1 itself and the friction force generated based upon the coefficient of friction between circuit board 1 and the paired conveyor belts 71a and 71b.

By tilting the fixed brush 13a on the upstream side so that a lower end of the fixed brush 13a is placed toward the downstream side in the board transporting direction "S" as shown in. FIG. 1, the circuit board 1 is allowed to easily enter the lower side of the fixed brush 13a on the upstream side. Once having been positioned on the lower side of the fixed brush 13a on the upstream side, the lower face of the circuit board 1 is subjected to a downward pushing force in the Z-direction by the fixed brush 13a, and pushed against the paired conveyor belts 71a and 71b, with the result that a stronger frictional force (between the circuit board 1 and the paired conveyor belts 71a and 71b) is maintained to ensure the transport propelling force. Thus, the effect for avoiding the issue of the stoppage of the circuit board 1 at the front side of the fixed brush 13a is obtained and it is possible to ensure a positive transportation of the circuit board 1 by the paired conveyor belts 71a and 71b. The tilt angle θ of the fixed brush 13a on the upstream side is 45 degrees <θ<90 degrees, and more preferably, at about 60 degrees.

Here, the other fixed brush 13b located on the downstream side in the board transporting direction "S" is placed virtually perpendicularly to the surface 1t of the circuit board 1, that is, placed so as to extend in the Z-direction. This is because, since the transport propelling force of the paired conveyor belts 71a and 71b in the board transporting direction "S" is sufficiently transmitted to the circuit board 1 by the downward pressing force in the Z-direction by the fixed brush 13a on the upstream side and the downward pressing force in the Z-direction by the rotary brush 12, the circuit board 1 is prevented from stopping at the front side of the fixed brush 13b (the upstream side in the board transporting direction "S" even when the circuit board 1 comes into contact with the fixed brush 13b located on the downstream side. In contrast, when the fixed brush 13b on the downstream side is tilted in the board transporting direction "S" air accumulation tends to occur, and might cause a reduction in the cleaning effect. However, it may be tilted on demand.

With respect to further functional effects obtained by installing each of the fixed brushes 13a and 13b, since each of the fixed brushes 13a and 13b is made in contact with the circuit board 1 that has been transported, at least one of the fixed brushes 13a and 13b may be made from a conductive material so that static electricity, accumulated on the circuit board 1, can be static-eliminated toward the facility side (the board cleaning apparatus 10 side) through the fixing brush 13a and/or 13b. With respect to the brush made from a conductive material, for example, such a brush that is allowed to contain copper powder, has been known, and, more specifically, materials, such as Thunderon (trade name and registered trademark) made by Nihon Sanmo Dyeing Co., Ltd. and Monoeito (trade name) made by Toray Industries, Inc., may be used. By subjecting the circuit board 1 to the static-eliminating process, adhesion of foreign matters to the surface 1t of the circuit board 1 due to static electricity can be eliminated so that the cleaning effects are improved.

In the first embodiment, optionally, an effector plate 16, which is placed so as to extend from the upper side of the suction port 14a of the duct 14 shown in FIG. 1, and is made in contact with the peripheral portion 12b of the rotary brush 12, is installed. The effector plate 16 has two functions. That is, one function is that, since the effector plate 16 is made in contact with the peripheral portion 12b of the rotary brush 12 in rotation, the foreign matters accumulated on the rotary brush 12 can be wiped off to improve the brushing effect of the rotary brush 12. The foreign matters, wiped off by the effector plate 16, are effectively sucked from the suction port 14a of the duct 14 which is located lower side of the effector plate 16.

The other function of the effector plate 16 is to guide the stream of negative-pressure air from the negative-pressure supply source 60 so as to be smoothly directed toward the duct 14 from an operative position at which the peripheral portion 12b of the rotary brush 12 is in contact with the circuit board 1, without being bent upward inside the case 11 to be scattered. With this arrangement, it becomes possible to prevent the foreign matters wiped off and ejected from the surface 1t of the circuit board 1 by the rotary brush 12 from being drawn upward inside the case 11 to be re-circulated so that the foreign matters are effectively sucked into the duct 14 as indicated by the arrow B. In the example shown in FIG. 1, the effector plate 16 is cooperatively fastened to the case 11 and the duct 14; however, the effector plate 16 may be attached to either one of the case 11 and the duct 14.

With the board cleaning apparatus 10 in accordance with the first embodiment, a simple structure of attachment of the paired fixed brushes 13a and 13b makes it possible to cover the gap "g" between the case 11 and the surface 1t of the circuit board 1. Thus, the board cleaning apparatus 10 can be easily attached to an existing processing apparatus or transporting apparatus. Moreover, since each of the paired fixed brushes 13a and 13b can be made in contact with the entire width of the surface 1t of the circuit board 1, the board cleaning apparatus 10 can respond to circuit boards with various dimensions (for example, the circuit boards 1a and 1b).

Referring to the drawings, the following description will discuss a board cleaning apparatus 20 in accordance with a second embodiment. The second embodiment aims to improve the duct and the rotary brush so that the suction effects for the foreign matters can be enhanced. As shown in FIG. 5A earlier, the ducts 54 in the conventional art are installed at two positions side by side in the length direction of the case 51 or at a plurality positions thereof, in a manner so as to extend perpendicularly from the case 51. As described above, the structures of the ducts 54 in conventional art are provided because, in order to prevent the leak of negative-pressure air through the gap "g" (see FIG. 5B) between the circuit board 1 and the lower end of the case 51 that frequently occurs, an attempt is made so as to carry out suction processes near the rotary brush 52 over the entire width direction of the circuit board 1 by preparing a plurality of suction ports. The layout of the plurality of ducts 54, however, tends to disperse the stream of the negative-pressure air, resulting in a reduction in the suction force in a reverse manner. Moreover, since the cylindrical ducts 54 are directly attached to the case 51, the floating foreign matters tend to accumulate at attaching corner portions (connection portions), etc., between the case 51 and the ducts 54.

Figure 2:
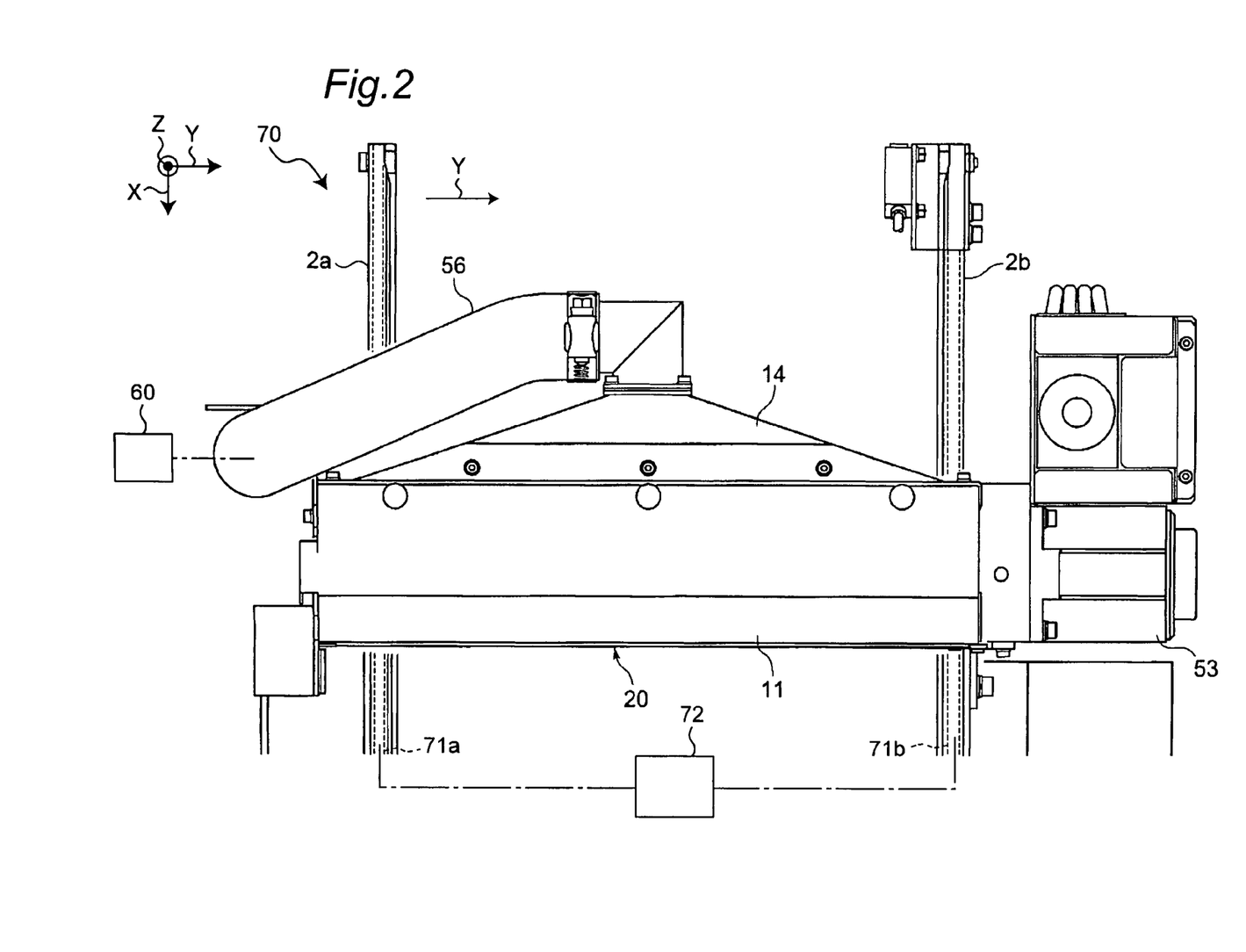
FIG. 2 is a plan view that shows a board transporting apparatus equipped with a board cleaning apparatus in accordance with another embodiment of the present invention.

FIG. 2 shows a board transporting apparatus 70 equipped with a board cleaning apparatus 20 in accordance with the second embodiment, and is a plan view that shows the board cleaning apparatus 20 viewed from above thereof, which is placed in a manner so as to bridge a pair of board transporting rails 2a and 2b. As shown in FIG. 2, a duct 14 relating to the second embodiment is formed into a funnel shape so as to concentrate its suction portion on one point near the center of the case 11 in the Y-direction. A hose 56 is connected to the duct 14, and is further connected to a negative-pressure supply source 60. Since the duct 14 is formed into the funnel shape from the case 11, the stream of negative-pressure air becomes smooth, and the above-mentioned corner portions at which the foreign matters tend to be accumulated are concentrated at one point so that the foreign matters are collected at the above-mentioned one point, thereby making it possible to be easily collected.

FIG. 1, explained in the first embodiment, shows the cross section of the side face of the duct 14 in accordance with the second embodiment. In FIG. 1, the suction port 14a of the duct 14 relating to the second embodiment is opened so as to have narrowed on the side to be connected to the case 11 in the Z-direction, and the structure of the suction port 14a allows air flowed therein to be narrowed; thus, the resulting effect is that the suction speed of the negative-pressure air is subsequently increased. In accordance with experiments conducted by the present inventors, in comparison with the board cleaning apparatus 50 in the conventional art, shown in FIG. 5A, the duct 14, shown in FIG. 1, in accordance with the second embodiment had an air flow rate of 1.57 m/sec at the negative-air suction time, while the duct 54 of the conventional art had an air flow rate of 0.42 m/sec, with the same blower being used; thus, it is clear that the flow rate, that is, the suction force upon sucking the foreign matters, is greatly improved.

As shown in FIG. 1, the duct 14 in accordance with the second embodiment functions more effectively, when used in combination with the board cleaning apparatus 10 in which each of the fixed brushes 13a and 13b is instated as explained in the first embodiment. In other words, in the conventional art, no fixed brushes 13a and 13b are installed, with the result that the negative-pressure air often leaks; therefore, the present embodiment provides a plurality of ducts 54 and an attempt is made so as to suck the foreign matters at a plurality of positions as close to the rotary brush 52 as possible. In contrast, with the board cleaning apparatus 20 of the second embodiment, the fixed brush 13 relating to the first embodiment is installed so that the leak of the negative-pressure air is suppressed, thereby making it possible to easily exert the suction force over the entire width of the circuit board 1, even when the suction port 14a is limited to one portion.

Figure 3:
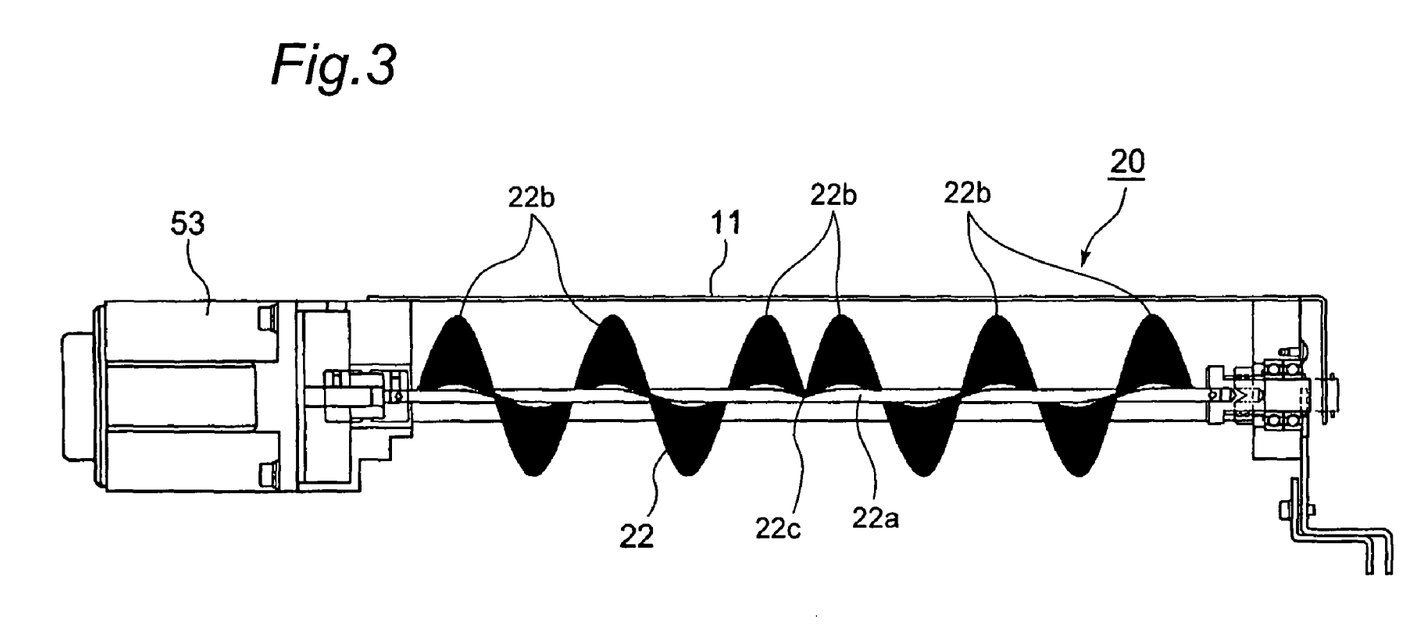
FIG. 3 is a side view that shows a rotary brush of the board cleaning apparatus shown in FIG. 2.

Next, FIG. 3 shows a rotary brush 22 to be used in the board cleaning apparatus 20 in accordance with the second embodiment. FIG. 3 is a side view of the board cleaning apparatus 20 on the upstream side viewed from the downstream side in the board transporting direction "S" of the circuit board 1, and a colored portion shown in FIG. 3 indicates a brush portion of the rotary brush 22. As shown in FIG. 3, the rotary brush 22 used in the second embodiment is divided into right and left two portions virtually at the center position 22c in the axial direction of an axis 22a, with spiral directions of the two brushes being reversed to each other. With respect to the above-mentioned spiral directions, when the rotary brush 22 is driven and rotated by the motor 53, the advancing directions of the spirals are respectively directed to the center position 22c from the right and left sides, and joined (connected) at the center position 22c. The suction port 14a of the duct 14 is positioned near the center position 22c of the rotary brush 22.

When, upon operation of the rotary brush 22 having the above-mentioned structure, the foreign matters adhering to the surface 1t of the circuit board 1 are wiped off and ejected from the surface 1t of the circuit board 1 by the peripheral portion 22b of the rotary brush 22, vectors that proceed toward the center position 22c of the rotary brush 22 in the axis direction are generated in the foreign matters. Herein, since the suction port 14a of the funnel-shaped duct 14 is positioned near the center position 22c, the foreign matters, directed toward the center position 22c by rotating the rotary brush 22, are efficiently sucked through the duct 14. This sucking effect is larger than a case of using the rotary brush 12 having one spiral direction as described in the first embodiment.

Next, referring to the drawings, the following description will discuss a board cleaning apparatus in accordance with a third embodiment. In the conventional art, when a narrow-width circuit board 1b is cleaned, an issue arises in which one of the board transporting rails 2a is moved so as to be shifted in accordance with the width dimension of the circuit board to cause a gap below the board cleaning apparatus, as described earlier. The aim of the third embodiment is to provide a technique that can improve this issue.

Figure 4A:
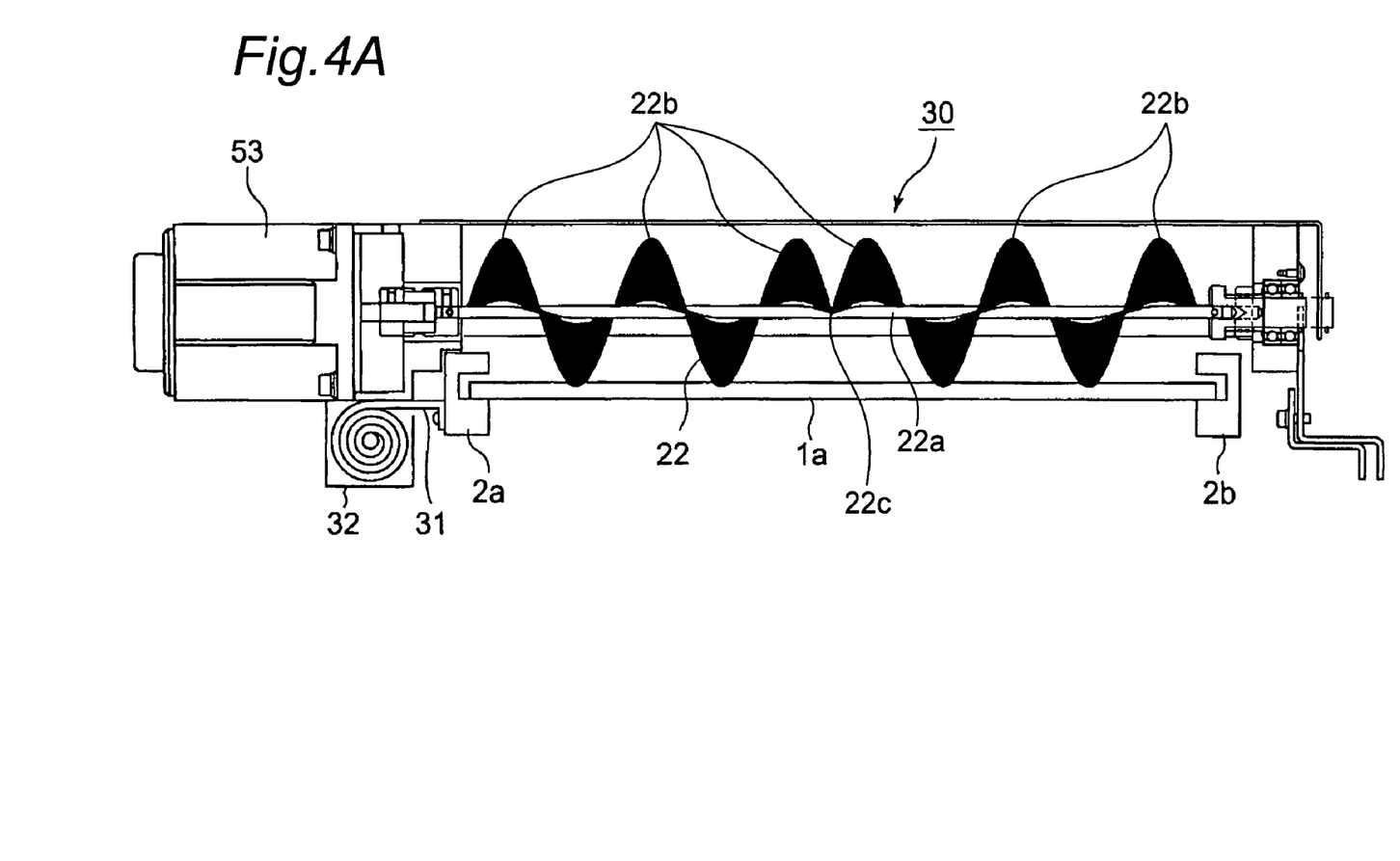
FIG. 4A is a side view that shows a board transporting apparatus equipped with a board cleaning apparatus in accordance with still another embodiment of the present invention in a state that foreign matters are removed from a surface of a wide-width circuit board

FIG. 4A is a side view of a board transporting apparatus 70 equipped with a board cleaning apparatus 30 in accordance with the third embodiment on the upstream side viewed from the downstream side of the circuit board 1 in the board transporting direction "S" A circuit board 1a shown in FIG. 4A, which has a wide width with the two ends thereof in the width direction being supported by the paired board transporting rails 2a and 2b, is transported in a direction perpendicular to the surface of the drawing. In the case of the wide-width circuit board 1a, when the circuit board 1a passes below the board cleaning apparatus 30, since the opened portion located below the board cleaning apparatus 30 is covered with the circuit board 1a over the entire width thereof, no issue of negative-pressure air leak occurs.

Figure 4B:
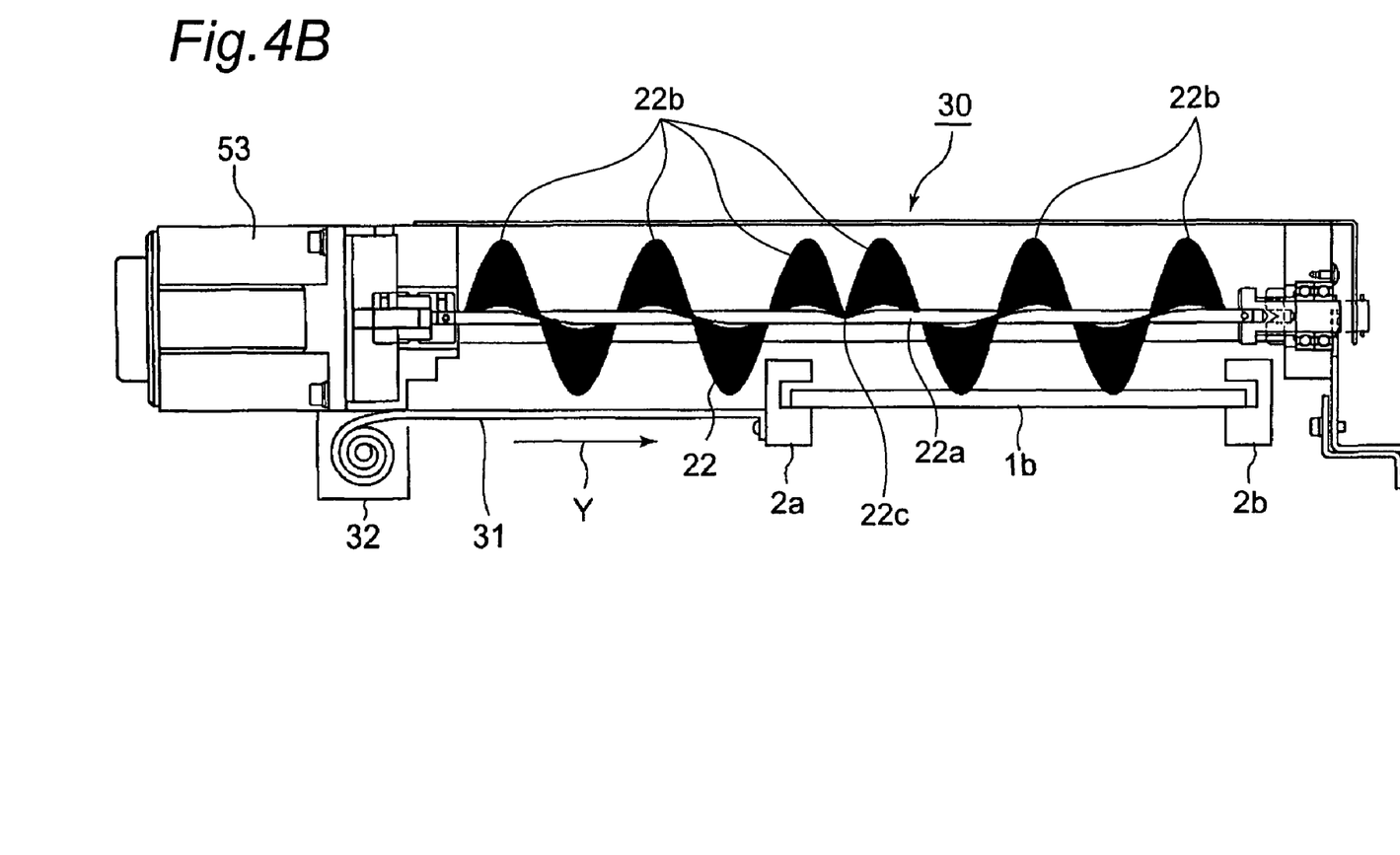
FIG. 4B is a side view that shows a board transporting apparatus equipped with a board cleaning apparatus in accordance with still another embodiment of the present invention in a state that foreign matters are removed from a narrow-width circuit board.

In contrast, in the case where the narrow-width circuit board 1b (for example, a circuit board having a width dimension which is a half of the wide-width circuit board 1a), shown in FIG. 4B, is used, one of the board transporting rails 2a is moved so as to be shifted toward the other board transporting rail 2b in the Y-direction. For this reason, the circuit board 1b is allowed to cover only one portion of the opened portion below the board cleaning apparatus 30. In order to improve this issue, the third embodiment aims to install a shutter panel 31 that forms a cover for the above-mentioned opened portion so that the rest of the portion below the board cleaning apparatus 30 (the portion not covered with the circuit board 1b) is covered to considerably reduce the leak of negative-pressure air. The shutter panel 31 which is one example of a shutter panel is fixed onto the board transporting rail 2a one end of which is moved so as to be shifted, with the other end being secured to and wound into a wind-up portion 32 which is one example of a housing. The wind-up portion 32 holds the shutter panel 31, while exerting a winding-up force like a tape measure of a wind-up type.

In the case where the wide-width circuit board 1a, shown in FIG. 4A, is used, virtually all the portion of the shutter panel 31 is housed inside the wind-up portion 32. Upon switching this to the narrow-width circuit board 1b as shown in FIG. 4B, as the board transporting rail 2a is shifted in the Y-direction, the shutter panel 31 one end of which is secured onto the board transporting rail 2a is successively drawn in a manner so as to cover the lower opened portion of the board cleaning apparatus 30 like a curtain, as shown in FIG. 4B.

In contrast, upon switching from a state shown in FIG. 4B to a state shown in FIG. 4A, that is, form the narrow-width circuit board 1b to the wide-width circuit board 1a, the board transporting rail 2a is shifted in a direction opposite to the Y-direction, and in accordance with this movement, the shutter panel 31 is wound up by the winding-up force of the inside of the wind-up portion 32. The shutter panel 31 is formed by a material such as a canvas cloth having a suppressed air permeability or a metal material such as a tape measure of a winding-up type. In any of the cases, the above-mentioned winding-up mechanism has been generally known.

The board cleaning apparatus 30 in accordance with the third embodiment is allowed to exert desirable effects when used in combination with, for example, the board cleaning apparatus 20 in accordance with the second embodiment. In other words, upon transporting the narrow-width circuit board 1b, a wide opening is generated below the apparatus, with the result that, when only one duct 14 is opened only at one point near the center position 22c of the rotary brush 22, a foreign-matter suction effect is hardly obtained when the opened section (the suction port 14a) is located in the opening. However, the use of the shutter panel 31 in accordance with the third embodiment makes it possible to prevent the leak of negative-pressure air even at the position at which no circuit board 1 is present; therefore, even in the case where the duct 14 in which only one opening is formed near the center position 22c of the rotary brush 22 as shown in the second embodiment is used, it is possible to exert a sufficient suction function onto the circuit boards 1 with various width dimensions. Moreover, the opening area of the suction port 14a of the duct 14 limited to one portion is narrowed so that the flow rate of negative-pressure air is increased, thereby providing effects, such as an increased suction force.

In the example shown in FIGS. 4A and 4B, the rotary brush 22 is divided in the center into two portions having mutually reversed winding directions in the spiral directions, as shown in the second embodiment; however, in the third embodiment, not limited to this structure, the rotary brush 12 having one direction in the spiral direction as described in the first embodiment may be used. Moreover, in the example shown in FIGS. 4A and 4B, the wind-up portion 32 for securing the other end of the shutter panel 31 is placed on the board cleaning apparatus 30; however, the wind-up portion 32 may be placed on the board transporting rail 2, with one end of the shutter panel 31 being secured onto the board cleaning apparatus 30. In the device of the type in which both of the paired board transporting rails 2a and 2b are mutually moved so as to be shifted toward each other, shutter panels 31 are respectively placed on both of the rails.

The above description has discussed the board cleaning apparatuses of the respective embodiments in accordance with the present invention, and each of the contents indicated by the respective embodiments may be used alone, or these may be desirably used in combination. In comparison with the use of each of these alone, the use of these in combination makes it possible to provide better foreign-matter suction effects, as shown in the above examples.

Moreover, the present invention also includes a board transporting apparatus 70 (see FIG. 2) provided with the corresponding board cleaning apparatus 10, 20, or 30. The board transporting apparatus 70 supports the circuit board 1 from the two sides in the width direction by a pair of board transporting rails 2a and 2b facing each other, the two end portions of the circuit board 1 are carried by each of conveyor belts 71a and 71b located within the paired board transporting rails 2a and 2b having a U-sectional shape, and a motor 72 connected to each of the conveyor belts 71a and 71b is driven so that the circuit board 1 is transported in the board transporting direction "S". The board cleaning apparatus 10, 20, or 30 is attached in a manner so as to bridge the rails in a direction (Y-direction) orthogonal to the board transporting direction "S" of the circuit board 1; thus, one of the board transporting rails 2a can be moved so as to be shifted toward the other board transporting rail 2b so that the foreign matters adhering to the surface 1t of the transported circuit board 1 are removed.

The board cleaning apparatus and the board transporting apparatus relating to the present invention are widely applicable to the circuit board manufacturing field in which a circuit board is transported so that a viscous material is printed on the surface thereof or a component is mounted thereon.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2005-208167 filed on Jul. 19, 2005 including specification, drawing and claims are incorporated herein by reference in its entirety.

What is claimed is:

1. A board cleaning apparatus for cleaning a circuit board which is moved in a board transporting direction by a board transporting apparatus having a pair of board transporting rails, the board cleaning apparatus comprising:
   a box-shaped case having an opened face opposed to a surface of the circuit board, the box-shaped case extending in a width direction of the circuit board perpendicular to the board transporting direction;
   a rotary brush installed in the case for rotating about an axis extending in a direction perpendicular to the board transporting direction;
   a motor for rotatably driving the rotary brush;
   a duct communicated with and connected to the case so as to permit suction of air inside the case;
   an effector plate having a first end attached to the case or the duct and a second end extending from the case or the duct and contacting a peripheral portion of the rotary brush, the effector plate being disposed so as to wipe off foreign matter adhering to the rotary brush and to prevent particles from being drawn upward into the case to be re-circulated;

a first fixed brush attached to an upstream portion of the case, the upstream portion being located at an upstream side of the case in the board transporting direction with respect to the rotary brush, the first fixed brush being disposed so as to contact the surface of the circuit board over an entire width of the circuit board; and a second fixed brush attached to a downstream portion of the case, the downstream portion being located at a downstream side of the case in the board transporting direction with respect to the rotary brush, the second fixed brush being disposed so as to contact the surface of the circuit board over an entire width of the circuit board, wherein the first fixed brush and the second fixed brush are arranged such that an area is defined between the first fixed brush and the second fixed brush in which a negative pressure applied to the case via the duct sucks air in the case while the motor rotates the rotary brush to remove foreign matter adhering to the surface of the circuit board, wherein a part of the upstream portion of the case is tilted toward the downstream side of the case, wherein the first fixed brush is attached to the part of the upstream portion of the case such that the first fixed brush is tilted in the same direction as the part of the upstream portion of the case wherein a rotary direction of the rotary brush in an area that the rotary brush comes into contact with the circuit board is opposite to the board transporting direction, and wherein the duct is disposed upstream of the tilted part of the upstream portion of the case.

2. The board cleaning apparatus according to claim 1, wherein
the first fixed brush is tilted at an angle smaller than 90 degrees and larger than 45 degrees with respect to the board transporting direction.

3. The board cleaning apparatus according to claim 1, wherein
one of the first fixed brush and the second fixed brush is made of a conductive material so that static electricity in the circuit board is static-eliminated through the fixed brush.

4. The board cleaning apparatus according to claim 1, wherein the rotary brush has two spiral-shaped brushes that are joined to each other near a center position of the rotary brush in the width direction of the circuit board, the spiral-shaped brushes having spiral directions reversed to each other, and
the duct is formed into a funnel shape having one opening end communicated with and connected to the case at a point near a center of the case in the width direction of the circuit board.

5. The board cleaning apparatus according to claim 1, further comprising:
a cover for covering an opening of an opened face of the case, the opening being caused when the pair of board transporting rails are shifted in accordance with the width dimension of the circuit board.

6. The board cleaning apparatus according to claim 5, wherein
the cover is configured by a shutter member that has a first end and a second end, the first end being secured to a housing attached to one of the board cleaning apparatus and the board transporting rails, and being housed in the housing, and
the second end of the shutter member being secured to the other one of the board cleaning apparatus and the board transporting rails.

7. The board cleaning apparatus according to claim 1, wherein the first fixed brush is tilted at an angle of 60 degrees with respect to the board transporting direction.

8. The board cleaning apparatus according to claim 1, wherein the first fixed brush has an attached end and a free end, the attached end being attached to the case such that the first fixed brush extends at an angle relative to the transporting direction.

9. The board cleaning apparatus according to claim 1, wherein a part of the downstream portion of the case extends in a direction substantially perpendicular to the board transporting direction, and
wherein the second fixed brush is attached to the part of the downstream portion of the case such that the second fixed brush extends away from the case in a direction substantially perpendicular to the board transporting direction.

10. The board cleaning apparatus according to claim 1, wherein a part of the downstream portion of the case extends in a direction perpendicular to the board transporting direction, and
wherein the second fixed brush is attached to the part of the downstream portion of the case such that the second fixed brush extends away from the case in a direction perpendicular to the board transporting direction.

11. The board cleaning apparatus according to claim 1, wherein the first fixed brush has an attached end and a free end, the attached end being attached to the case and being tilted toward the downstream side of the case.

12. The board cleaning apparatus according to claim 1, wherein the first fixed brush is attached to the part of the upstream portion of the case such that the first fixed brush is tilted toward the downstream side of the case at substantially the same angle as the part of the upstream portion of the case.

13. The board cleaning apparatus according to claim 1, wherein the first fixed brush has an attached end and a free end, the attached end being attached to the case such that the attached end is tilted toward the downstream side of the case at substantially the same angle as the part of the upstream portion of the case.

14. The board cleaning apparatus according to claim 13, wherein a part of the downstream portion of the case extends in a direction substantially perpendicular to the board transporting direction, and
wherein the second fixed brush is attached to the part of the downstream portion of the case such that the second fixed brush extends away from the case in a direction substantially perpendicular to the board transporting direction.

15. The board cleaning apparatus according to claim 13, wherein a part of the downstream portion of the case extends in a direction perpendicular to the board transporting direction, and
wherein the second fixed brush is attached to the part of the downstream portion of the case such that the second fixed brush extends away from the case in a direction perpendicular to the board transporting direction.

16. The board cleaning apparatus according to claim 1, wherein the part of the upstream portion of the case extends downwardly and toward the downstream side of the case.

17. The board cleaning apparatus according to claim 1, wherein the effector plate is disposed inside the case such that the negative pressure air is guided into the duct by the effector plate and such that the foreign matter carried in the negative pressure air is prevented from being drawn upward into the case to be re-circulated.

18. The board cleaning apparatus according to claim 1, wherein the rotary direction of the rotary brush is such that a portion of the rotary brush between the axis of rotation of the rotary brush and the opened face of the case rotates toward the upstream side of the case.

19. A board transporting apparatus comprising:
- a pair of board transporting rails for supporting a circuit board from both sides thereof in a width direction;
- a pair of conveyor belts that are installed inside the pair of board transporting rails, respectively, for transporting the circuit board along the pair of board transporting rails in a board transporting direction; and
- a board cleaning apparatus that removes foreign matters adhering to a surface of the circuit board transported in the board transporting direction, the board cleaning apparatus comprising:
  - (i) a box-shaped case having an opened face opposed to a surface of the circuit board, the box-shaped case extending in a width direction of the circuit board perpendicular to the board transporting direction;
  - (ii) a rotary brush installed in the case for rotating about an axis extending in a direction perpendicular to the board transporting direction;
  - (iii) a motor for rotatably driving the rotary brush;
  - (iv) a duct communicated with and connected to the case so as to permit suction of air inside the case;
  - (v) an effector plate having a first end attached to the case or the duct and a second end extending from the case or the duct and contacting a peripheral portion of the rotary brush, the effector plate being disposed so as to wipe off foreign matter adhering to the rotary brush and to prevent particles from being drawn upward into the case to be re-circulated;
  - (vi) a first fixed brush attached to an upstream portion of the case, the upstream portion being located at an upstream side of the case in the board transporting direction with respect to the rotary brush, the first fixed brush being disposed so as to contact the surface of the circuit board over an entire width of the circuit board; and
  - (vii) a second fixed brush attached to a downstream portion of the case, the downstream portion being located at a downstream side of the case in the board transporting direction with respect to the rotary brush, the second fixed brush being disposed so as to contact the surface of the circuit board over an entire width of the circuit board,
- wherein the first fixed brush and the second fixed brush are arranged such that an area is defined between the first fixed brush and the second fixed brush in which a negative pressure applied to the case via the duct sucks air in the case while the motor rotates the rotary brush to remove foreign matter adhering to the surface of the circuit board,
- wherein a part of the upstream portion of the case is tilted toward the downstream side of the case,
- wherein the first fixed brush is attached to the part of the upstream portion of the case such that the first fixed brush is tilted in the same direction as the part of the upstream portion of the case,
- wherein a rotary direction of the rotary brush in an area that the rotary brush comes into contact with the circuit board is opposite to the board transporting direction, and
- wherein the duct is disposed upstream of the tilted part of the upstream portion of the case.

* * * * *